(12) United States Patent
Chiu et al.

(10) Patent No.: US 8,741,738 B2
(45) Date of Patent: Jun. 3, 2014

(54) METHOD OF FABRICATION OF A SEMICONDUCTOR APPARATUS COMPRISING SUBSTRATES INCLUDING AL/GE AND CU CONTACT LAYERS TO FORM A METALLIC ALLOY

(75) Inventors: Yi Hsun Chiu, Zhubei (TW); Ting-Ying Chien, Hsinchu (TW); Ching-Hou Su, Hsinchu (TW); Chyi-Tsong Ni, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/156,052

(22) Filed: Jun. 8, 2011

(65) Prior Publication Data
US 2012/0313246 A1 Dec. 13, 2012

(51) Int. Cl.
H01L 21/30 (2006.01)
(52) U.S. Cl.
USPC ........... 438/455; 438/406; 438/612; 438/617; 438/652; 257/762; 257/771; 257/782; 257/459; 257/E23.023
(58) Field of Classification Search
USPC ....................................................... 257/616
See application file for complete search history.

(56) References Cited

U.S. PATENT DOCUMENTS

| 7,138,293 | B2 | 11/2006 | Ouellet et al. | |
|---|---|---|---|---|
| 7,442,570 | B2 * | 10/2008 | Nasiri et al. | 438/48 |
| 2004/0262772 | A1 | 12/2004 | Ramanathan et al. | |
| 2005/0029333 | A1 | 2/2005 | Koyama et al. | |
| 2010/0224994 | A1 | 9/2010 | Yun | |
| 2012/0049978 | A1 * | 3/2012 | Pang et al. | 333/189 |
| 2012/0115305 | A1 * | 5/2012 | Peng et al. | 438/455 |
| 2012/0187509 | A1 * | 7/2012 | Gottfried et al. | 257/417 |

FOREIGN PATENT DOCUMENTS

WO WO 2010034650 A2 * 4/2010

OTHER PUBLICATIONS

Jaeguer. Richard. Introduction to microelectronic fabrication. 2002. Prentice Hall p. 135.*
Hiromu Ishii. Selective deposition on Si using thermal decomposition of GeH4. Appl. Phys. Lett 47 (8) Oct. 15, 1985.*
Jacobson, David. Principles of Brazin ASM International, 2005. p. 98. ASM International.*
Reif, Rafael et al., "3-D Interconnects Using Cu Wafer Bonding: Technology and Applications", Microsystems Technology Laboratories, Massachusetts Institute of Technology, Cambridge MA.
Morrow, P. R. et al., "Three-Dimensional Wafer Stacking Via Cu—Cu Bonding Integrated With 65-nm Strained-Si/Low-k CMOS Technology", IEEE Electron Device Letters, vol. 27, No. 5, May 2006, pp. 335-337.
Drozdov, M. et al., "In-Depth Microstructural Investigation of Copper Wire-Bonds", K & S Copper Summit Conference 2008, pp. 1-22.

* cited by examiner

*Primary Examiner* — Howard Weiss
*Assistant Examiner* — Cesar Lopez
(74) *Attorney, Agent, or Firm* — Lowe Hauptman & Ham, LLP

(57) ABSTRACT

The disclosure relates to integrated circuit fabrication, and more particularly to a semiconductor apparatus with a metallic alloy. An exemplary structure for an apparatus comprises a first silicon substrate; a second silicon substrate; and a contact connecting each of the first and second substrates, wherein the contact comprises a Ge layer adjacent to the first silicon substrate, a Cu layer adjacent to the second silicon substrate, and a metallic alloy between the Ge layer and Cu layer.

19 Claims, 7 Drawing Sheets

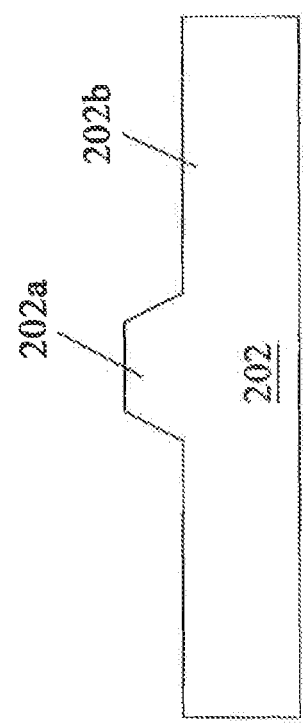

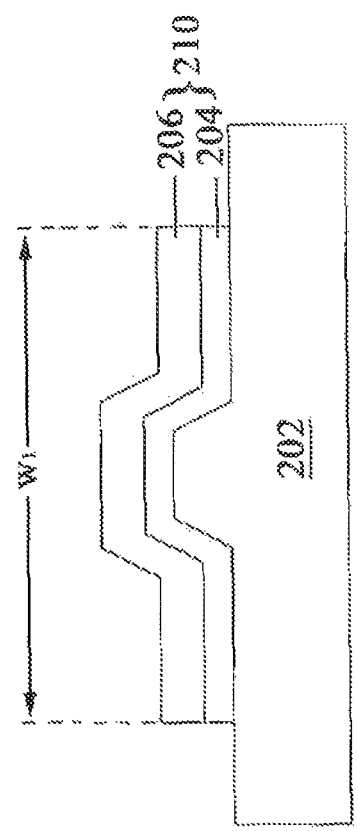

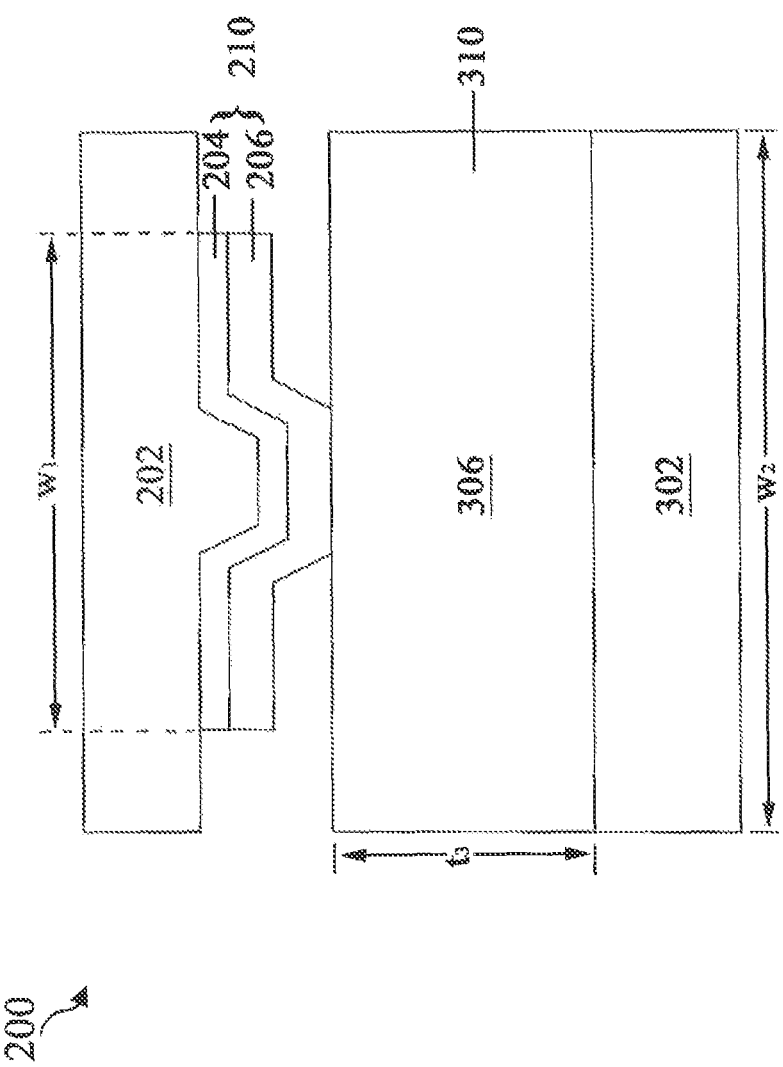

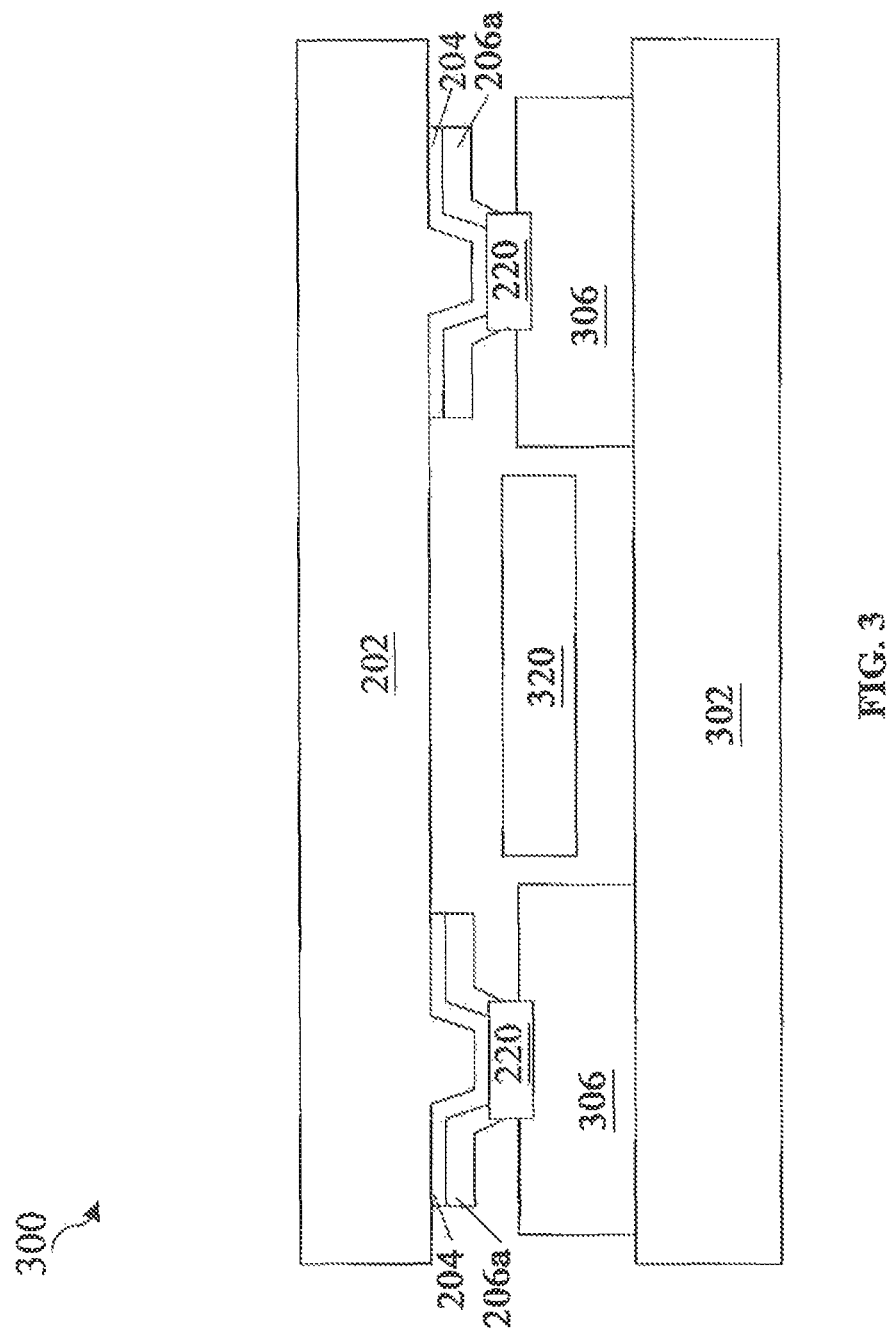

METHOD OF FABRICATION OF A SEMICONDUCTOR APPARATUS COMPRISING SUBSTRATES INCLUDING AL/GE AND CU CONTACT LAYERS TO FORM A METALLIC ALLOY

FIELD OF THE INVENTION

The invention relates to integrated circuit fabrication and, more particularly, to a semiconductor apparatus with a metallic alloy

BACKGROUND

Microelectromechanical system (MEMS) technology is the integration of very small mechanical devices, such as sensors, valves, gears, reflecting mirrors, and drivers on a computer, which are installed inside a silicon substrate. Thus, MEMS devices are often called intelligent machines. To protect against external interference during operation, it may be desirable to bond the MEMS devices with a cap substrate to hermetically seal the devices to form a semiconductor apparatus. Furthermore, in many applications, it is also desirable for the bonded substrates to include integrated circuit (IC) devices.

However, there are challenges to implementing such features and processes in MEMS or IC device fabrication. For example, in a "substrate bonding" process, it is difficult to achieve a low-contact-resistance bond between bonded substrates because high-contact-resistance materials are generated in the interface between the bonded substrates, thereby increasing the likelihood of semiconductor apparatus instability and/or semiconductor apparatus failure.

Accordingly, what is needed is a method to form a low-contact-resistance bond between bonded substrates.

SUMMARY

In one embodiment, a semiconductor apparatus comprises a first silicon substrate; a second silicon substrate; and a contact connecting each of the first and second substrates, wherein the contact comprises a Ge layer adjacent to the first silicon substrate, a Cu layer adjacent to the second silicon substrate, and a metallic alloy between the Ge layer and Cu layer.

In another embodiment, a semiconductor apparatus comprises a first silicon substrate; a second silicon substrate, wherein one of the first or second silicon substrates comprises a micro-electro-mechanical system (MEMS) and the other substrate comprises a complementary metal-oxide-semiconductor (CMOS) circuitry; and a contact connecting each of the first and second substrates, wherein the contact comprises a Ge layer adjacent to the first silicon substrate, a Cu layer adjacent to the second silicon substrate, and a metallic alloy between the Ge layer and Cu layer.

In still another embodiment, a method of fabricating a semiconductor apparatus comprises providing a first silicon substrate having a first contact, wherein the first contact comprises a Ge layer interposed between the substrate and an Al layer; providing a second silicon substrate having a second contact, wherein the second contact comprises a Cu layer as an outmost layer; placing the first contact in contact with the second contact; and heating the first and second contacts to form a metallic alloy, wherein the heating is performed at a temperature of about 420° to 500° C. and under a compressive force of about 45 to 55 kN.

A detailed description is given in the following embodiments with reference to the accompanying drawings.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A-2E show schematic cross-sectional views of a metallic alloy of a semiconductor apparatus at various stages of fabrication according to various aspects of the present disclosure; and FIG. 3 is a cross-sectional view of a semiconductor apparatus having a metallic alloy fabricated using the steps shown in FIG. 2A-2E.

DESCRIPTION

Figure 1:
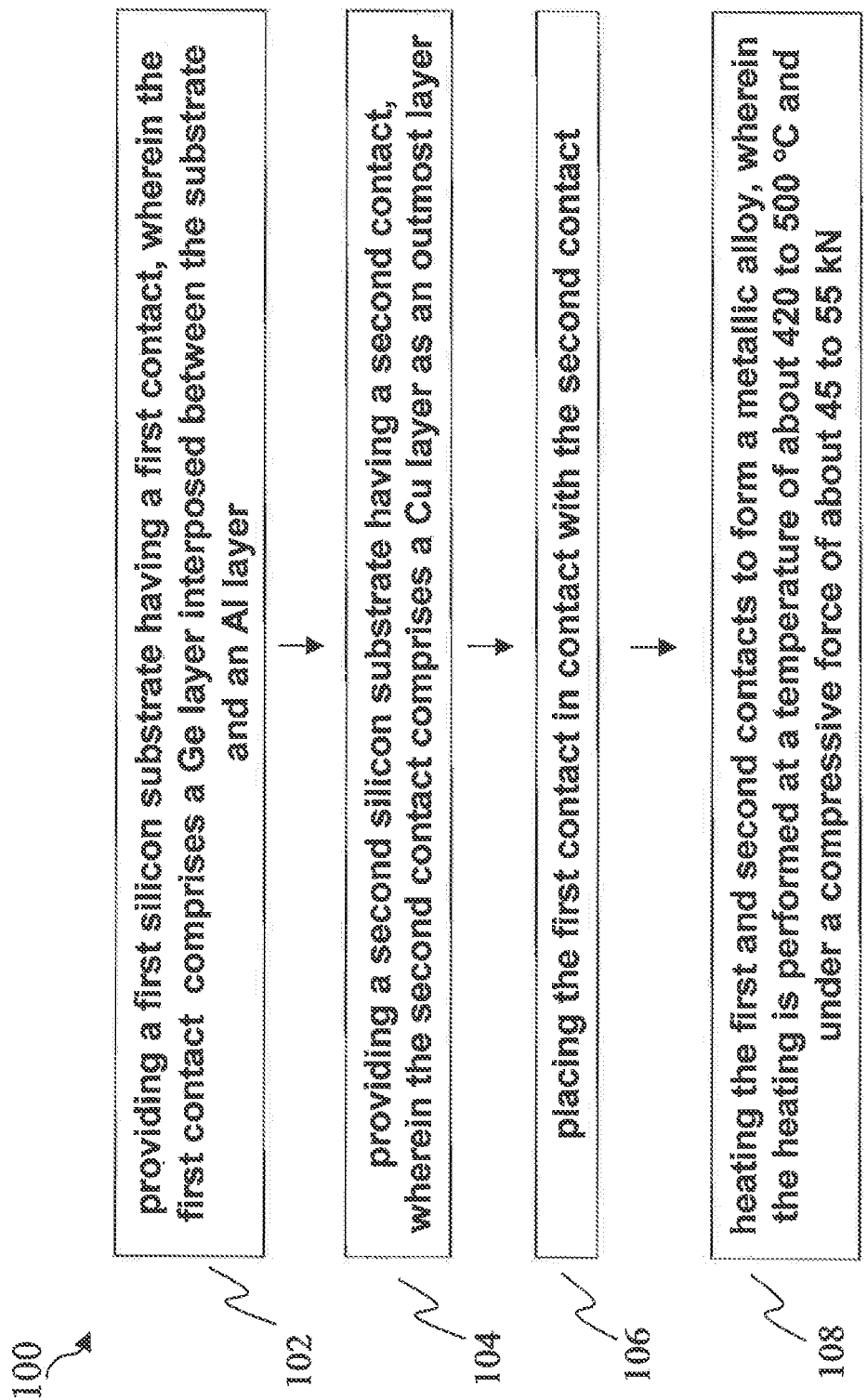
FIG. 1 is a flowchart illustrating a method of fabricating a semiconductor apparatus comprising a metallic alloy according to various aspects of the present disclosure.

It is understood that the following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Various features may be arbitrarily drawn in different scales for simplicity and clarity. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, illustrated is a flowchart of a method 100 of fabricating a semiconductor apparatus comprising a metallic alloy according to various aspects of the present disclosure. The method 100 begins with step 102 in which a first silicon substrate having a first contact is provided, wherein the first contact comprises a Ge layer interposed between the substrate and an Al layer. The method 100 continues with step 104 in which a second silicon substrate having a second contact is provided, wherein the second contact comprises a Cu layer as an outmost layer. The method 100 continues with step 106 in which the first contact is placed in contact with the second contact. The method 100 continues with step 108 in which the first and second contacts are heated to form a metallic alloy, wherein the heating is performed at a temperature of about 420° to 500° C. and under a compressive force of about 45 to 55 kN. The discussion that follows illustrates an embodiment of a method in accordance with FIG. 1.

FIGS. 2A-2E show schematic cross-sectional views of a metallic alloy 220 of a semiconductor apparatus 200 at various stages of fabrication according to various aspects of the present disclosure. It is noted that the method of FIG. 1 does not produce a completed semiconductor apparatus 200.

Accordingly, it is understood that additional processes may be provided before, during, and after the method 100 of FIG. 1, and that some other processes may only be briefly described herein. Also, FIGS. 2A through 2E are simplified for a better understanding of the inventive concepts of the present disclosure. For example, although the figures illustrate the metallic alloy 220 of a semiconductor apparatus 200, it is understood the semiconductor apparatus 200 may be part of an integrated circuit that further comprises a number of other components such as under-fill, lead-frame, etc.

Figure 2B:
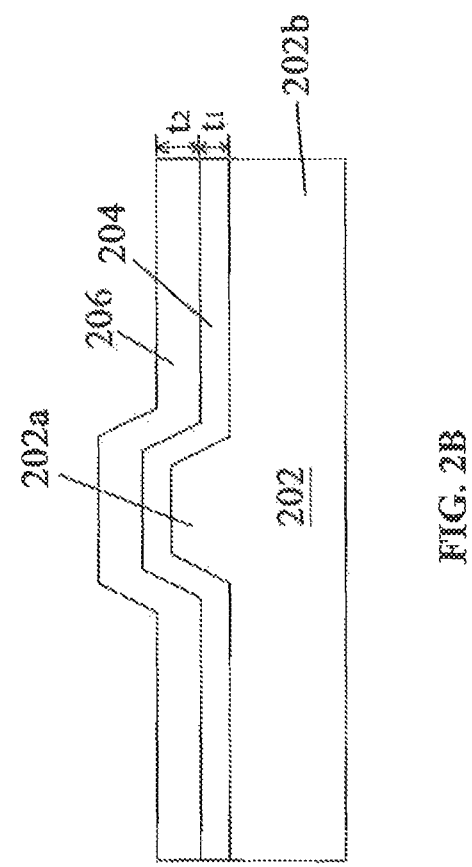

Referring to FIGS. 2A-2C, a first silicon substrate 202 is provided. The step of providing the first silicon substrate 202 may further comprise partially fabricating a first contact 210, wherein the first contact 210 comprises a Ge layer 204 interposed between the substrate 202 and an Al layer 206. The first silicon substrate 202 may comprise a pure silicon substrate. In another embodiment, the first silicon substrate 202 may be a semiconductor on insulator such as silicon on insulator (SOI) or silicon on sapphire. In other embodiments, the substrate 202 may comprise a doped epitaxial (epi) layer, a gradient semiconductor layer, and/or may further include a semiconductor layer overlying another semiconductor layer of a different type such as a silicon layer on a silicon germanium layer.

In one embodiment, the first silicon substrate 202 may further comprise a plurality of micro-electromechanical system (MEMS) devices (not shown). The MEMS devices are the integration of very small mechanical devices installed inside the first silicon substrate 202 such as sensors, valves, gears, reflecting mirrors, and drivers on a computer. Therefore, the MEMS devices can be used for a variety of devices including oscillators, channels, pumps, accelerometers, and filters. The MEMS devices may be manufactured using surface micromechanics, deposition, or etching technologies.

In another embodiment, the first silicon substrate 202 may further comprise a plurality of isolation features (not shown), such as shallow trench isolation (STI) features or local oxidation of silicon (LOCOS) features. The isolation features may define and isolate various microelectronic elements (not shown).

Examples of the various microelectronic elements that may be formed in the first silicon substrate 202 comprise transistors (e.g., p-channel/n-channel metal oxide semiconductor field effect transistors (pMOSFETs/nMOSFETs), bipolar junction transistors (RITs), voltage transistors, high frequency transistors, etc.); diodes; resistors; capacitors; inductors; fuses; and other suitable elements. Various processes are performed to form the various microelectronic elements including deposition, photolithography, implantation, etching, annealing, and other suitable processes. The microelectronic elements are interconnected to form an integrated circuit (IC) device, such as a logic device, memory device (e.g., static random access memory or SRAM), radio frequency (RF) device, input/output (I/O) device, system-on-chip (SoC) device, combinations thereof, and other suitable types of devices.

The substrate 202 further comprises inter-layer dielectric (HD) layers, inter-metal dielectric (IMD) layers and a metallization structure overlying the IC device. The IMD layers in the metallization structure include low-k dielectric materials, un-doped silicate glass (USG), fluorine-doped silicate glass (FSG), carbon-doped silicate glass, silicon nitride, silicon oxynitride, or other materials. The dielectric constants (k value) of the low-k dielectric materials may be less than about 3.9, or less than about 2.3. Metal lines in the metallization structure may be formed of aluminum, aluminum alloy, copper, copper alloys, or other conductive materials. One skilled in the art will realize the formation details of the metallization structure.

Still referring to FIG. 2A, the first silicon substrate 202 further comprises a raised portion 202a for electrically connecting the MEMS device or IC device to an external contact, and lowered portions 202b to accommodate proof mass of the MEMS device. Various processes are performed to form the raised portion 202a including photolithography, etching and other suitable processes. While only one raised portion 202a is illustrated as being formed in the first silicon substrate 202, it is understood that any number of raised portions 202a may be formed in the first silicon substrate 202.

Referring to FIG. 213, after the raised portion 202a formation process, a Ge layer 204 is then deposited over, and extending out of the lowered portions 202h and onto the raised portion 202a. The Ge layer 204 may be formed by chemical vapor deposition (CVD), physical vapor deposition (PVD), sputtering, or other suitable technique. In the CVD embodiment, the Ge layer 204 may be formed using a low-pressure chemical vapor deposition (LPCVD) process. The LPCVD process can be carried out in a standard LPCVD furnace at a temperature of about 350° to 380° C., using $GeH_4$ as the Ge source gas in the sputtering embodiment, the Ge layer 204 may be formed using Ge as a target and Ar as a sputtering gas under a bias power of about 450 to 1000 W. In the present embodiment, the Ge layer 204 has a thickness $t_1$ ranging from 1000 to 5000 angstroms.

Then, an Al layer 206 may be formed over the Ge layer 204. The Al layer 206 is intended to comprise substantially a layer including pure elemental Al, Al containing unavoidable impurities, or Al alloys containing minor amounts of elements such as Cu or Si. The Al layer 206 may be formed by atomic layer deposition (ALD), PVD, sputtering, or other suitable technique. In one embodiment, the Al layer 206 may be formed using Al as a target and Ar as a sputtering gas under a bias power of about 6000 to 12000 W. In the present embodiment, the Al layer 206 has a thickness $t_2$ ranging from 2000 to 10000 angstroms.

Then, a layer of photoresist (not shown) is formed over the Al layer 206 by a suitable process, such as spin-on coating, and patterned to form a patterned photoresist feature by a proper lithography patterning method. A width of the patterned photoresist feature is in the range of about 30 to 80 μm. The patterned photoresist feature can then be transferred using a dry etching process to the underlying layers (i.e., the Al layer 206 and the He layer 204) to fOrm first contact 210 (shown in FIG. 2C). The first contact 210 is used in the bonding process to electrically connect the MEMS device or IC device in the respective silicon substrate to external features, such as a second contact 310 of the second silicon substrate 302 (shown in FIG. 2D). A first width $W_1$ of the first contact 210 is in the range of about 30 to 80 μm. The photoresist layer may be stripped thereafter.

The first silicon substrate 202 is then bonded onto a second silicon substrate 302 to form the semiconductor apparatus 200. The structure of FIG. 2D shows the first silicon substrate 202 is flipped upside down and engaged with the second silicon substrate 302 at the bottom. The second silicon substrate 302 may comprise a pure silicon substrate. In another embodiment, the second silicon substrate 302 may be a semiconductor on insulator such as silicon on insulator (SOI) or silicon on sapphire. In other embodiments, the second silicon substrate 302 may comprise a doped epi layer, a gradient semiconductor layer, and/or may further include a semiconductor layer overlying another semiconductor layer of a different type such as a silicon layer on a silicon germanium layer.

In one embodiment, the second silicon substrate 302 may further comprise a plurality of micro-electromechanical system (MEMS) devices (not shown). The MEMS devices are the integration of very small mechanical devices installed inside the second silicon substrate 302 such as sensors, valves, gears, reflecting mirrors, and drivers on a computer. Therefore, the MEMS devices can be used for a variety of devices including oscillators, channels, pumps, accelerometers, and filters. The MEMS devices may be manufactured using surface micromechanics, deposition, or etching technologies.

In another embodiment, the second silicon substrate 302 may further comprise a plurality of isolation features (not shown), such as shallow trench isolation (STI) features or local oxidation of silicon (LOCOS) features. The isolation features may define and isolate various microelectronic elements (not shown).

Examples of the various microelectronic elements that may be formed in the second silicon substrate 302 include transistors (e.g., p-channel/n-channel metal oxide semiconductor field effect transistors (pMOSEETs/nMOSFETs), bipolar junction transistors (BJTs), high voltage transistors, high frequency transistors, etc.); diodes; resistors; capacitors; inductors; fuses; and other suitable elements. Various processes are performed to form the various microelectronic elements including deposition, photolithography, implantation, etching, annealing, and other suitable processes. The microelectronic elements are interconnected to form an integrated circuit (IC) device, such as a logic device, memory device (e.g., static random access memory or SRAM), radio frequency (RE) device, input/output (I/O) device, system-on-chip (SoC) device, combinations thereof, and other suitable types of devices.

The second silicon substrate 302 further comprises interlayer dielectric (ILD) layers, inter-metal dielectric (EMI)) layers and a metallization structure overlying the integrated circuit device (not shown). The IMI) layers in the metallization structure include low-k dielectric materials, un-doped silicate glass (USG), fluorine-doped silicate glass (FSG), carbon-doped silicate glass, silicon nitride, silicon oxynitride, or other materials. The dielectric constants (k value) of the low-k dielectric materials may be less than about 3.9, or less than about 2.3. Metal lines in the metallization structure may be formed of aluminum, aluminum alloy, copper, copper alloys, or other conductive materials. One skilled in the art will realize the formation details of the metallization structure.

The second silicon substrate 302 further comprises a second contact 310. The second contact 310 is a top metallization layer formed in a top-level. IMD layer, which is a portion of conductive routes and has an exposed surface treated by a planarization process, such as chemical mechanical polishing (CMP), if necessary. The second contact 310 is used in the bonding process to electrically connect the MEMS device or IC device in the respective silicon substrate to external features, such as the first contact 210 of the first silicon substrate 202. In other words, the first contact 210 is placed in contact with the second contact 310 (shown in FIG. 2D). In one embodiment, a second width $W_2$ of the second contact 310 is greater than the first width $W_1$ of the first contact 210. In another embodiment, the second width $W_2$ of the second contact 310 is less than the first width $W_1$ of the first contact 210. In the present embodiment, a width ratio ($W_1/W_2$) of the first contact 210 to the second contact 310 is from about 0.12 to 1.2.

The second contact 310 may comprise a Cu layer 306 as an outermost layer. The copper layer 306 is intended to comprise substantially a layer including pure elemental copper, copper containing unavoidable impurities, and copper alloys containing minor amounts of elements such as tantalum, indium, tin, zinc, manganese, chromium, titanium, platinum, magnesium, aluminum or zirconium. The Cu layer 306 may be formed using sputtering, electro plating, electroless plating, and CVD methods. For example, electro-chemical plating (ECP) is carried out to form the copper layer 306. In the exemplary embodiment, the Cu layer 306 has a thickness $t_3$ ranging from 5000 to 20000 angstroms.

Before placing the first contact 210 in contact with the second contact 310, native oxides (not shown) may form on an exposed top surface of the Al layer 206, as well as a top surface of the Cu layer 306, due to exposure to air. The native oxides need to be cleaned (i.e., removed) because the Al and Cu layers 206, 306 will not alloy with each other if the native oxides exist between the Al layer 206 and Cu layer 306.

In embodiments of the disclosure, a pre-clean process to remove the native oxides is performed in a pre-clean chamber with a reducing gas, such as hydrogen or $NH_3$, and an inert gas, such as argon, helium or nitrogen. The ratio of the reducing gas to the inert gas depends upon such factors as the particular reaction chamber being used and the particular gasses being used.

In one embodiment, the reducing gas is hydrogen and the inert gas is helium. The hydrogen reactive pre-clean process advantageously removes the native oxide by reducing the native oxide without physical bombardment. Thus, the native oxide can be removed without damaging the exposed topsurface of the Al layer 206, as well as the top surface of the Cu layer 306. This facilitates attempts to form and maintain precise separation distances between silicon substrates 202 and 302, because the Al layer 206 and the Cu layer 306 both remain relatively smooth.

The process steps up to this point have provided the silicon substrates 202 and 302 having fresh and smooth surfaces to make it easier for alloying the Al layer 206 and the Cu layer 306 with each other. This can reduce defect generation in the interface between the bonded silicon substrates 202 and 302, and upgrade semiconductor apparatus performance.

Figure 2E:
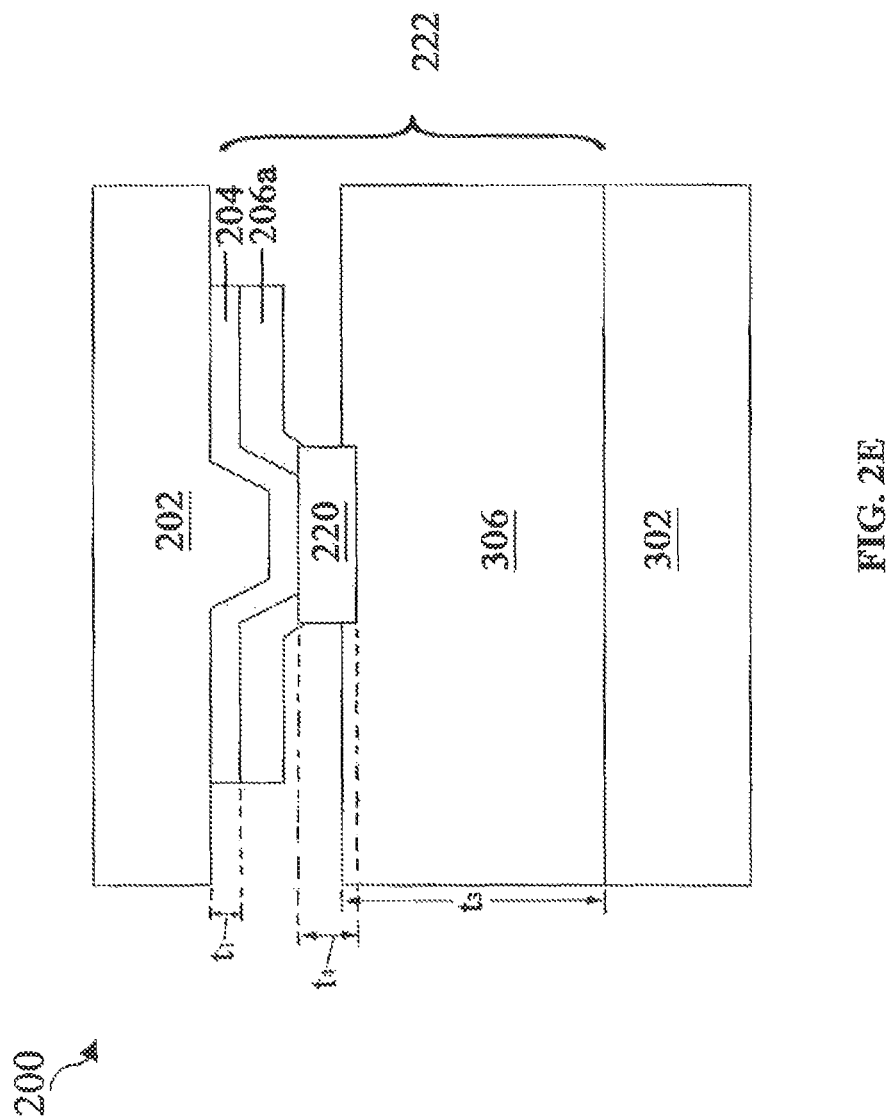

Referring to FIG. 2E, after placing the first contact 210 in contact with the second contact 310, the Al layer 206 and Cu layer 306 are heated to form a metallic alloy 220, whereby the metallic alloy 220 bonds the first contact 210 to the second contact 310. Although other pressures are also possible, silicon substrates 202 and 302 are pressed together under a compressive force of about 45 to 55 kN to form a weak bond between the first contact 210 and the second contact 310.

The pressed silicon substrates 202 and 302 are then placed in an annealing chamber. A bonding process is then performed on the structure of the semiconductor apparatus 200 by varying the temperature within the annealing chamber in order to form the metallic alloy 220 by alloying the Al layer 206 and Cu layer 306, which couples the two silicon substrates 202, 302. In this regard, the temperature of the annealing chamber is increased to about 480° C. within about 60 seconds once the pressed silicon substrates 202 and 302 are placed in the annealing chamber. Although not necessary for implementing the embodiments, it may change the temperature linearly (i.e., "ramp" the temperature) when the temperature of the annealing chamber is being varied.

In the present embodiment, the step of heating is performed under a compressive force of about 45 to 55 kN and at a temperature of about 450° to 500° C. for about 40 minutes. It should be noted that other annealing temperatures and durations are possible for forming a sufficient bond between the silicon substrates 202 and 302. A bond is "sufficient" for the purposes of the present disclosure when it is capable of maintaining an alignment of the first silicon substrates 202 with respect to the second silicon substrates 302 during normal operation of the semiconductor apparatus 200.

However, the eutectic temperature (about 548° C.) of the Al layer 206 and Cu layer 306 is greater than the heating temperature (about 480° C.) in the process of alloying the Al layer 206 and Cu layer 306. Thus, the Al layer 206 and Cu layer 306 will not alloy with each other at the heating temperature of about 450° to 500° C. In the present embodiment, the Al layer 206 is first reflowed by introduction of Ge into the Al layer 206, because the eutectic temperature (about 420° C.) of the Ge layer 204 and Al layer 206 is less than the heating temperature (about 480° C.) in the process. A bonding process is then performed on the structure of the semiconductor apparatus 200 by alloying the reflowed Ge-containing Al layer 206a and Cu layer 306 to form the metallic alloy 220. In the present embodiment, the metallic alloy 220 comprises an alloy of Ge, Al, and Cu. In some embodiments, portion of the reflowed Ge-containing Al layer 206a, which does not directly contact with the Cu layer 306, may not alloy with the Cu layer 306 due to a long diffusion distance.

At this point, the Ge layer 204, metallic alloy 220, and Cu layer 306 are combined and referred to as a contact 222. The contact 222 connects each of the first and second substrates 202, 302, wherein the contact 222 comprises the Ge layer 204 adjacent to the first silicon substrate 202, the Cu layer 306 adjacent to the second silicon substrate 302, and a metallic alloy 220 between the Ge layer 204 and Cu layer 306.

in the present embodiment, the metallic alloy 220 may bond the Ge layer 204 and Cu layer 306, and be sufficient to keep first silicon substrates 202 attached and aligned to the second silicon substrates 302. In other words, the metallic alloy 220 provides the semiconductor apparatus 200 with mechanical support and low-resistance connection, and the other conductive materials such as the Ge layer 204 and Cu layer 306 provide an electrical connection between the MEMS device of the first silicon substrate 202 and the IC device of the second silicon substrate 302. In one embodiment, one of the first or second silicon substrates 202 and 302 comprises a micro-electro-mechanical system (MEMS) device and the other substrate comprises an integrated circuit (IC) device. In another embodiment, the first silicon substrate 202 comprises a micro-electro-mechanical system (MEMS) device and the second silicon substrate 302 comprises an integrated circuit (IC) device. Accordingly, Applicant's method of fabricating a semiconductor apparatus 200 may fabricate a low-resistance metallic alloy for bonding the silicon substrates 202 and 302 and upgrade semiconductor apparatus performance.

In the present embodiment, the metallic alloy 220 comprises an alloy of Ge, Al, and Cu. The metallic alloy 220 may comprise a metallic compound. In one embodiment, the metallic compound comprises $Al_2Cu$. In another embodiment, the metallic, compound comprises AlCu. In still another embodiment, the metallic compound comprises $Al_4Cu_9$. In the present embodiment, the metallic alloy 220 has a thickness $t_4$ ranging from 2000 to 10000 angstroms. In some embodiments, a thickness ratio of the metallic alloy 220 to the Ge layer 204 ($t_4/t_1$) is from about 0.4 to 10. In some embodiments, a thickness ratio ($t_4/t_3$) of the metallic alloy 220 to the Cu layer 306 is from about 0.2 to 2.

After maintaining the annealing temperature for the prescribed time, the temperature of the annealing chamber is decreased below about 100° C. in about 6 minutes. One skilled in the art should realize that other temperatures and times are possible for the bonding process.

FIG. 3 is a cross-sectional view of a semiconductor apparatus 300 having a metallic alloy 220 fabricated using the steps shown in FIG. 2A-2E. A supporting mechanism (not shown) which elastically supports mass proof of MEMS device 320 such as a mirror on the first silicon substrate 202 in which the mirror floats from the first silicon substrate 202, so that the mirror can be inclined in an arbitrary direction. On the other hand, mass proof of MEMS device 320 such as a rotor may be floating above the second silicon substrate 302 and controlled by a driving structure (not shown).

It is understood that the semiconductor apparatus 300 may undergo further IC processing to form various features such as under-fill, lead-frame, etc.

While the disclosure has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of fabricating a semiconductor apparatus comprising:
providing a first silicon substrate having a first contact, wherein the first contact comprises a Ge layer interposed between the substrate and an Al layer;
providing a second silicon substrate having a second contact, wherein the second contact comprises a Cu layer as an outmost layer;
placing the first contact in contact with the second contact; and
heating the first and second contacts to form a metallic alloy, wherein the heating is performed at a temperature of about 420° to 500° C. and under a compressive force of about 45 to 55 kN.

2. The method of claim 1, wherein the metallic alloy comprises an alloy of Ge, Al, and Cu.

3. The method of claim 1, wherein a thickness ratio of the metallic alloy to the Cu layer is from about 0.2 to 2.

4. The method of claim 1, wherein one of the first or second silicon substrates comprises a micro-electro-mechanical system (MEMS) and the other substrate comprises a complementary metal-oxide-semiconductor (CMOS) circuit.

5. The method of claim 1, wherein the first silicon substrate comprises a micro-electro-mechanical system (MEMS) and the second silicon substrate comprises a complementary metal-oxide-semiconductor (CMOS) circuit.

6. The method of claim 1, wherein the Ge layer is formed using a low-pressure chemical vapor deposition (LPCVD) process.

7. The method of claim 6, wherein the LPCVD process is performed using $GeH_4$ as the Ge source gas.

8. The method of claim 1, wherein the Ge layer is formed using a sputtering process.

9. The method of claim 8, wherein the sputtering process is performed using Ge as a target and Ar as a sputtering gas.

10. A method of fabricating a semiconductor apparatus comprising:
forming a first contact over a first substrate, the first contact comprising Al and Ge that entirely cover a raised portion of the first substrate, wherein the forming the first contact comprises:
forming a Ge layer over the first substrate; and
forming an Al-containing layer over the Ge layer;

forming a second contact over a second substrate, the second contact comprising a Cu-containing layer;

placing the first contact in contact with the second contact; and heating the first and second contacts to form a metallic alloy structure, wherein the heating is performed in a chamber at a temperature within a range from about 420° C. to 500° C.

11. The method of claim 10, wherein the heating is performed in the chamber under a compressive force ranging from about 45 kN to 55 kN.

12. The method of claim 10, wherein the formation of the metallic alloy structure is controlled to cause a thickness ratio of the metallic alloy structure to the Ge layer ranging from about 0.4 to 10.

13. The method of claim 10, wherein the formation of the metallic alloy structure is controlled to cause a thickness ratio of the metallic alloy structure to the Cu-containing layer ranging from about 0.2 to 2.

14. The method of claim 10, wherein the Ge layer is formed using a low-pressure chemical vapor deposition (LPCVD) process.

15. The method of claim 14, wherein the LPCVD process is performed using $GeH_4$ as the Ge source gas.

16. The method of claim 10, wherein the Ge layer is formed using a sputtering process.

17. The method of claim 16, wherein the sputtering process is performed using Ge as a target and Ar as a sputtering gas.

18. A method of fabricating a semiconductor apparatus comprising:

forming a first contact over a first substrate, the first contact comprising an Al-containing layer and a Ge layer between the Al-containing layer and the first substrate;

forming a second contact over a second substrate, the second contact comprising a Cu-containing layer;

placing the first contact in contact with the second contact; and heating the first and second contacts to form a metallic alloy structure, wherein the heating is performed at a temperature that is greater than a eutectic temperature of Ge and Al and less than a eutectic temperature of Cu and Al.

19. The method of claim 18, wherein the heating is performed under a compressive force, applied to the first contact and the second contact, ranging from about 45 kN to 55 kN.

* * * * *